(12) United States Patent
Boisvert et al.

(10) Patent No.: US 11,895,763 B2
(45) Date of Patent: Feb. 6, 2024

(54) CONVERTIBLE PLASMA SOURCE AND METHOD

(71) Applicants: THE ROYAL INSTITUTION FOR THE ADVANCEMENT OF LEARNING/MCGILL UNIVERSITY, Montréal (CA); NEXPLASMAGEN INC., Montréal (CA)

(72) Inventors: Jean-Sébastien Boisvert, Montréal (CA); Philip Wong, Toronto (CA); Valérie Léveillé, Montréal (CA)

(73) Assignees: THE ROYAL INSTITUTION FOR THE ADVANCEMENT OF LEARNING/MCGILL UNIVERSITY, Montreal (CA); NEXPLASMAGEN INC., Montreal (CA)

( * ) Notice: Subject to any disclaimer, the term of this patent is extended or adjusted under 35 U.S.C. 154(b) by 227 days.

(21) Appl. No.: 17/250,953

(22) PCT Filed: Aug. 5, 2020

(86) PCT No.: PCT/CA2020/051067
§ 371 (c)(1),
(2) Date: Apr. 1, 2021

(87) PCT Pub. No.: WO2021/022371
PCT Pub. Date: Feb. 11, 2021

(65) Prior Publication Data
US 2022/0353982 A1    Nov. 3, 2022

Related U.S. Application Data

(60) Provisional application No. 62/883,327, filed on Aug. 6, 2019.

(51) Int. Cl.
*H05H 1/24* (2006.01)
*H01J 37/32* (2006.01)
*H01J 37/244* (2006.01)

(52) U.S. Cl.
CPC ......... *H05H 1/245* (2021.05); *H01J 37/3244* (2013.01); *H05H 1/2406* (2013.01)

(58) Field of Classification Search
CPC ............ H01J 37/32009; H01J 37/3244; H01J 37/32449; H01J 2237/334; H01J 37/244;
(Continued)

(56) References Cited

U.S. PATENT DOCUMENTS 5,363,781 A * 11/1994 Chang ..................... F23G 7/008
                                                                110/238
7,608,839 B2   10/2009 Coulombe et al.
(Continued)

FOREIGN PATENT DOCUMENTS

EP    3 506 847    4/2022
JP    2003100733   4/2003
(Continued)

OTHER PUBLICATIONS

Léveillé, V. et Coulombe, S. Design and preliminary characterization of a miniature pulsed rf apgd torch with downstream injection of the source of reactive species. Plasma Sources Sci. Technol. 14, 467 (2005).
(Continued)

*Primary Examiner* — Wei (Victor) Y Chan
(74) *Attorney, Agent, or Firm* — LAVERY, DE BILLY, LLP; Gwendoline Bruneau

(57) ABSTRACT

A plasma source comprising a first hollow electrode and a second hollow electrode separated by a gap and a dielectric barrier of a constant width; wherein the plasma source is configured to selectively produce a plasma in either one of
(Continued)

a first configuration and a second configuration; wherein, i) in the first configuration, a plasma-forming gas flows in the gap while a non plasma-forming gas flows within the first hollow electrode; and ii) in the second configuration, a plasma-forming gas flows within the first hollow electrode and a non plasma-forming gas flows within the gap. The method comprises selecting at least two gases of different breakdown voltages, injecting a first gas in a first electrode separated from a second hollow electrode by a gas gap of a constant width, injecting a second gas in the gas gap under an applied power.

20 Claims, 11 Drawing Sheets

(58) Field of Classification Search
CPC ........ H01J 37/32082; H01J 2237/2817; H05H 1/3442; H05H 1/3452; H05H 1/3473; H05H 1/4652; H05H 1/473; H05H 2240/00; H05H 2242/20
See application file for complete search history.

(56) References Cited

U.S. PATENT DOCUMENTS

| 8,994,271 B2 | 3/2015 | Kindel et al. |
| 2007/0029500 A1 | 2/2007 | Coulombe et al. |
| 2010/0033096 A1* | 2/2010 | Choi .................. H01J 37/3244 315/111.21 |
| 2011/0142724 A1* | 6/2011 | Moon .................... H01J 37/32 422/186 |

FOREIGN PATENT DOCUMENTS

| JP | 2005129484 | 5/2005 |
| WO | 2005125286 | 12/2005 |

OTHER PUBLICATIONS

Boisvert, J.-S. Transition des basses fréquences aux hautes frequences d'une décharge à barrière diélectrique en hélium à la pression atmosphérique, thèse à l'Université de Montreal, (2016).
Graves, D. The emerging role of reactive oxygen and nitrogen species in redox biology and some implications for plasma applications to medicine and biology. Journal of Physics D: Applied Physics, 45, 263001 (2012).
Reuter, S. et al. Controlling the ambient air affected reactive species composition in the effluent of an argon plasma jet. IEEE Transactions on Plasma Sci. 40, 2788-2794 (2012).
Moisan, M. et Nowakowska, H. Surface-wave (SW) sustained plasma columns: their contribution to the modeling of RF and microwave discharges with new insight into some of their features. A survey of other types of SW discharges. Plasma Sources Sci. Technol. 27, 073001 (2018).
Boisvert, J.-S. et al. Time and space-resolved experimental investigation of the electron energy distribution function of a helium capacitive discharge at atmospheric pressure. Journal of Physics D: Applied Physics, 52, 245202 (2019).
Herzberg, G. et Hubert, K. P. Molecular spectra and molecular structure. Springer (1979).
LXCat, https://nl.Ixcat.net/home/, 2019.
Moisan et al. Sterilization/disinfection of medical devices using plasma: the flowing afterglow of the reduced-pressure N2—O2 discharge as the inactivating medium. The European Physical Journal Applied Physics. 63, 10001 (2013).
Dewhirst, M. W., Viglianti, B., Lora-Michiels, M., Hanson, M., and Hoopes, P. Basic principles of thermal dosimetry and thermal thresholds for tissue damage from hyperthermia. International journal of hyperthermia 19, 267-294 (2003).
Atale, N., Gupta, S., Yadav, U.S.C., and Rani, V. Cell-death assessment by fluorescent and nonfluorescent cytosolic and nuclear staining techniques. Journal of Microscopy (2014).
Mi-Hyoung, K. et al. Quantitative proteomic analysis of single or fractionated radiation-induced proteins in human breast cancer MDA-MB-231 cells. Cell & Bioscience 5, 2 (2015).
Amaya, C. et al. A genomis approach to identify susceptibilities of breast cancer cells to "fever-range" hyperthermia. BMC cancer 14, 81 (2014).
Meyer, B. et al. Clustered DNA damage induces pan-nuclear H2AX phosphorylation mediated by ATM and DNA-PK. Nucleic acids research, 41, 6109-6118 (2013).
Ivashkevich, A. et al. Use of the γ-H2AX assay to monitor DNA damage and repair in translational cancer research. Cancer letters, 327, 123-133 (2012).
Patra, B. et al. On-chip combined radiotherapy and chemotherapy testing on soft-tissue sarcoma spheroids to study cell death using flow cytometry and clonogenic assay, Scientific reports, 9, 2214 (2019).
Suvarna, K.S. Layton, C. and Bancroft, J.D. Bancroft's Theory and Practice of Histological Techniques. Elsevier Health Sciences. 8th Edition (2019).
Woo Seok Kang et al.: "Effect of Gas Injection Mixing on Reactive Species Transport in an Atmospheric Pressure Cold Plasma Jet"— 2012 Abstracts, IEEE International Conference on Plasma Science, Dec. 24, 2012 (Dec. 24, 2012) DOI: 10.I 109/PLASMA.2012. 6383843.
M. Laroussi et al.: "Arc-Free Atmospheric Pressure Cold Plasma Jets: A Review"—Plasma Process. Polym. 2007, 4, 777-788, Nov. 12, 2007 (Nov. 12, 2007), DOI: 10.1002/ppap.200700066.
European Search Report issued in corresponding EP application No. 20850277.3—dated Aug. 17, 2022.
Ninomiya et al., Evaluation of extra- and intracellular OH radical generation, cancer cell injury, and apoptosis induced by a non-thermal atmospheric-pressure plasma jet (2014)_English Abstract.

* cited by examiner

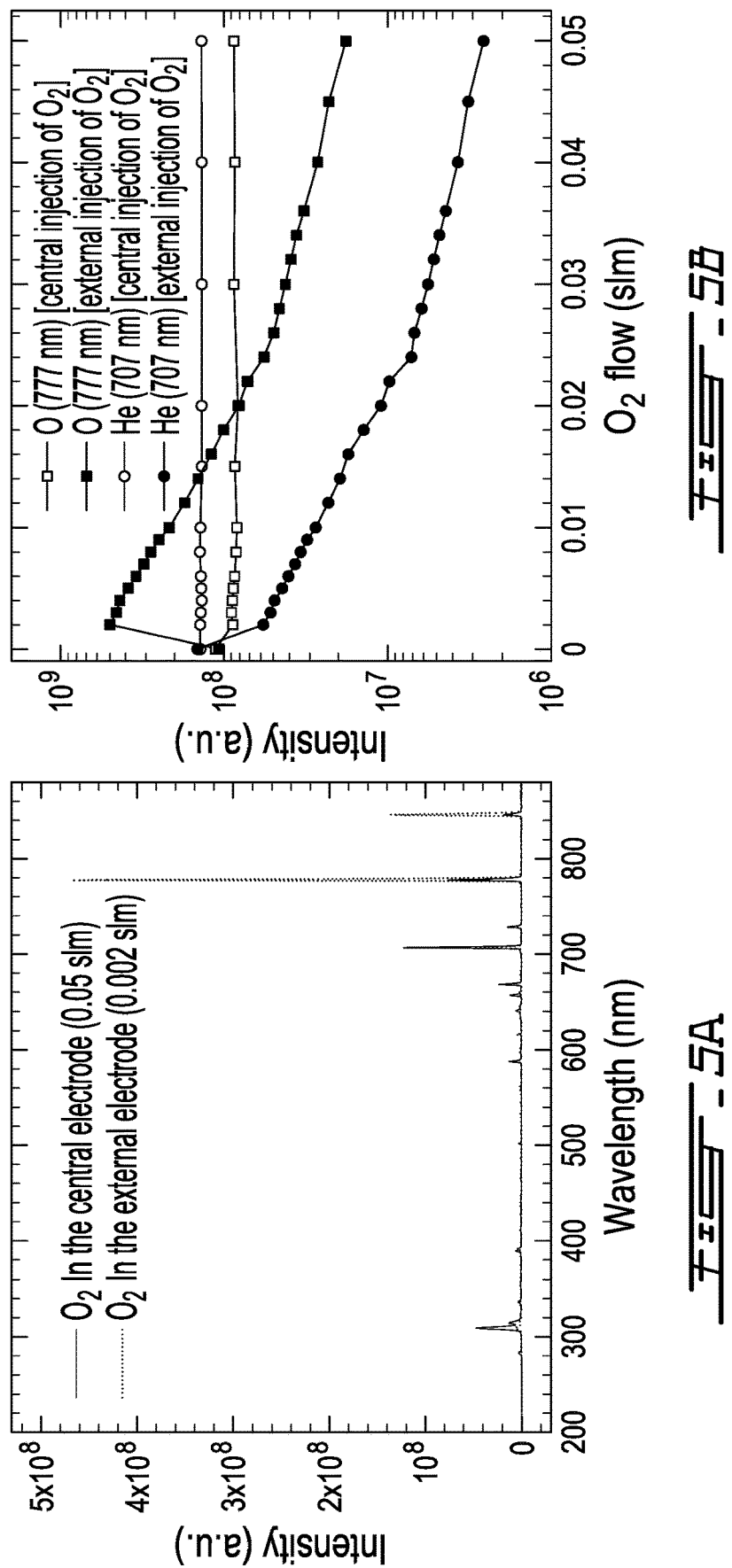

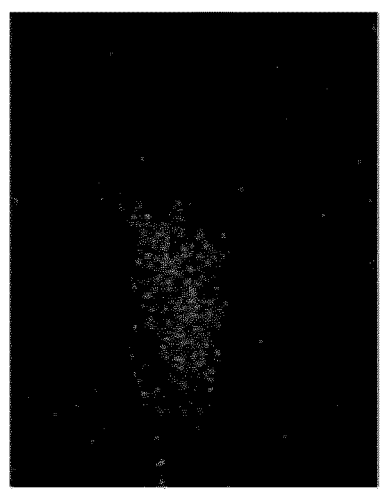 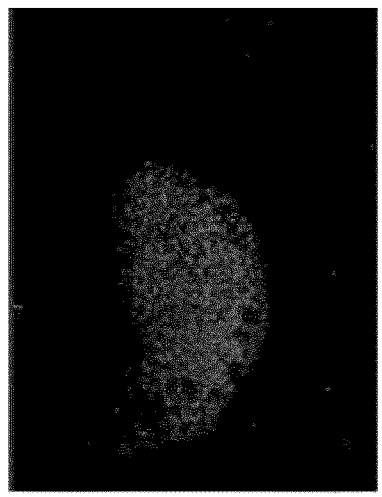
FIG. 9A
 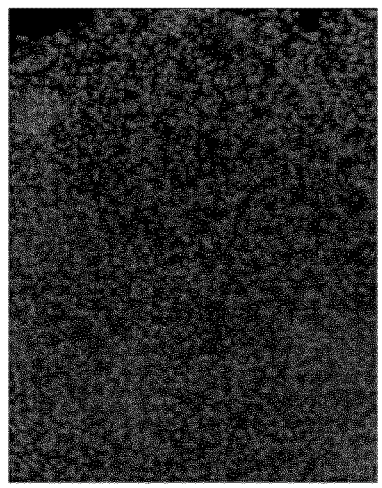
FIG. 9B
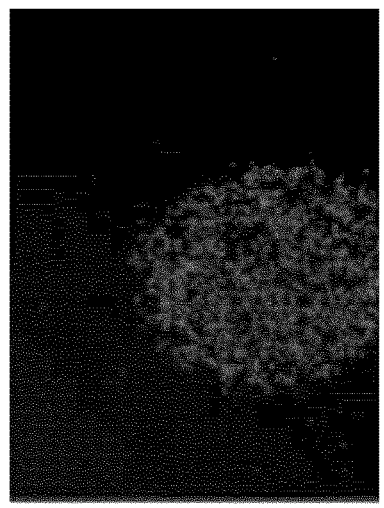 
FIG. 9C

CONVERTIBLE PLASMA SOURCE AND METHOD

CROSS-REFERENCE TO RELATED APPLICATIONS

This application is a National Entry Application of PCT application no PCT/CA2020/051067 filed on Aug. 5, 2020 and published in English under PCT Article 21(2), which itself claims benefit of U.S. provisional application Ser. No. 62/883,327, filed on Aug. 6, 2019. All documents above are incorporated herein in their entirety by reference.

FIELD OF THE INVENTION

The present invention relates to a plasma source. More specifically, the present invention is concerned with a convertible plasma source and method.

BACKGROUND OF THE INVENTION

Non-thermal atmospheric pressure plasmas have been investigated with growing interest during the last few decades. In particular, recent research efforts have been devoted towards applications to different subdomains of biology such as agriculture, food processing and medicine.

While most plasma source sustain plasmas that can be optimized using control parameters such as gas flow rate, gas composition and applied power, few plasma sources possess the capability to change importantly the properties of the produced plasma. Indeed, varying the gas flow rate, gas composition and applied power can change plasma properties such as electron density and energy, although only in a limited range, typically, as defined by the non-thermal nature of the plasma, namely a rapid increase of the gas temperature well above room temperature when these parameters reach a certain threshold.

Modifying the excitation waveform may be used to gain better control of the plasma parameters; for example, the time and space averaged electron density can be raised by 3 orders of magnitude by increasing the frequency from kHz to MHz, while keeping the discharge near room temperature using a single plasma source. Nanosecond pulses and other non-sinusoidal waveforms, such as triangle and sawtooth waveforms, can also be used to tailor the properties of plasma. However, these methods usually require specialized equipment such a nanosecond pulser or air core custom transformers and, multiple power systems are needed for tailoring the properties at will.

There is still a need in the art for a plasma source and method.

SUMMARY OF THE INVENTION

More specifically, in accordance with the present invention, there is provided a plasma source, comprising a first hollow electrode and a second hollow electrode separated by a gap and a dielectric barrier of a constant width; wherein, providing a plasma-forming gas having a first breakdown voltage and a non plasma-forming gas having a second breakdown voltage larger than the first breakdown voltage, the plasma source is configured to selectively produce a plasma in either one of a first configuration and a second configuration; wherein, i) in the first configuration, the plasma-forming gas flows in the gap while the non plasma-forming gas flows within the first hollow electrode; and ii) in the second configuration, the plasma-forming gas flows within the first hollow electrode and the non plasma-forming gas flows within the gap.

There is further provided a method for producing cytotoxic reactive species, comprising injecting a first gas in a first electrode separated from a second hollow electrode by a gas gap of a constant width, and injecting a second gas in the gas gap under an applied power, the first and second gases having different breakdown voltages.

There is further provided a method for producing reactive species, comprising injecting a first gas in a first electrode separated from a second hollow electrode by a gas gap of a constant width, and injecting a second gas in the gas gap under an applied power, the first and second gases having different breakdown voltages.

There is further provided a plasma generation method, comprising selecting at least two gases of different breakdown voltages, injecting a first gas in a first electrode separated from a second hollow electrode by a gas gap of a constant width, injecting a second gas in the gas gap under an applied power Other objects, advantages and features of the present invention will become more apparent upon reading of the following non-restrictive description of specific embodiments thereof, given by way of example only with reference to the accompanying drawings.

BRIEF DESCRIPTION OF THE DRAWINGS

In the appended drawings:

FIG. 5A shows optical emission spectra of the plasma in first configuration in the γ mode with 25 W at the generator and a helium gas flow rate of 4.3 slm in the gap between central electrode and external electrode with 0.05 slm $O_2$ injected in the central electrode or 0.002 slm $O_2$ injected in the gap between central electrode and external electrode;

FIG. 5B shows influence of injection location of $O_2$ on the selected optical emissions of the discharge in the first configuration in the γ mode with 25 W at the generator and a helium gas flow in the gap between central electrode and external electrode of 4.3 slm;

FIG. 9A shows fluorescence microscopy images of the cells with propidium iodide staining immediately after treatment with the first configuration in Ω mode with MDA-MB-231 cell line at the bottom of a Petri dish at 5 mm from the end of the nozzle, power at the generator is 10 W and 4.3 slm of nominally pure helium is injected as a plasma-forming gas (Plasma) versus 4.3 slm nominally pure helium only (Gas);

FIG. 9B shows fluorescence microscopy images of the cells with propidium iodide staining immediately after treatment with the first configuration in γ mode with MDA-MB-231 cell line at the bottom of a Petri dish at 5 mm from the end of the nozzle, power at the generator is 35 W and 4.3 slm of nominally pure helium is injected as a plasma-forming gas (Plasma) versus 4.3 slm nominally pure helium only (Gas);

FIG. 9C shows fluorescence microscopy images of the cells with propidium iodide staining immediately after treatment with the second configuration in the jet mode with MDA-MB-231 cell line at the bottom of a Petri dish at 5 mm from the end of the nozzle, power at the generator is 35 W and 0.6 slm of nominally pure helium is injected as a plasma-forming gas (Plasma) versus 4.3 slm nominally pure helium only (Gas);

DESCRIPTION OF ILLUSTRATIVE EMBODIMENTS

The present invention is illustrated in further details by the following non-limiting examples.

According to an aspect of the present disclosure, the plasma source comprises a first and a second electrodes separated by a gas gap (GG) and a dielectric barrier (DB). Each one of the two electrodes is configured to contain a gas flow and is thus referred to herein as hollow.

In the examples illustrated herein, the first electrode is a powered central electrode (PE) and the second electrode is a grounded external electrode (GE). Alternatively, both electrodes may be powered; and a double excitation and therefore two electrodes supplied with different excitation waves may be used.

Figure 10A:
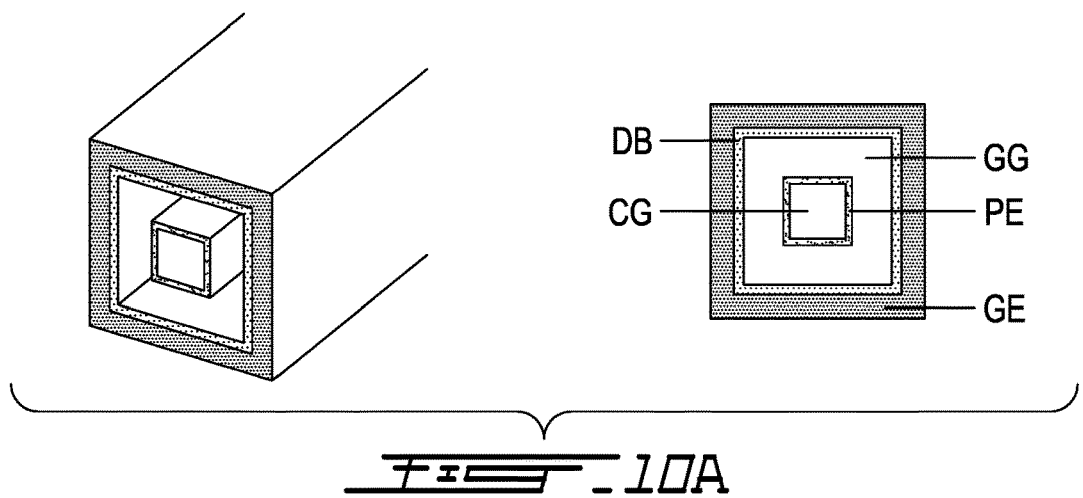
FIG. 10A shows a plasma geometry according to an embodiment of an aspect of the present invention.
Figure 10B:
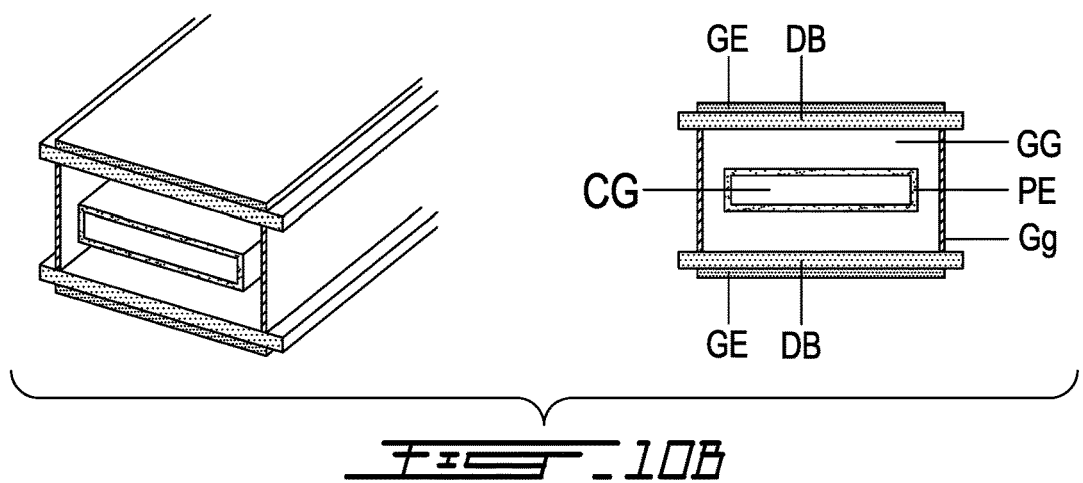
FIG. 10B shows a plasma geometry according to an embodiment of an aspect of the present invention.
Figure 10C:
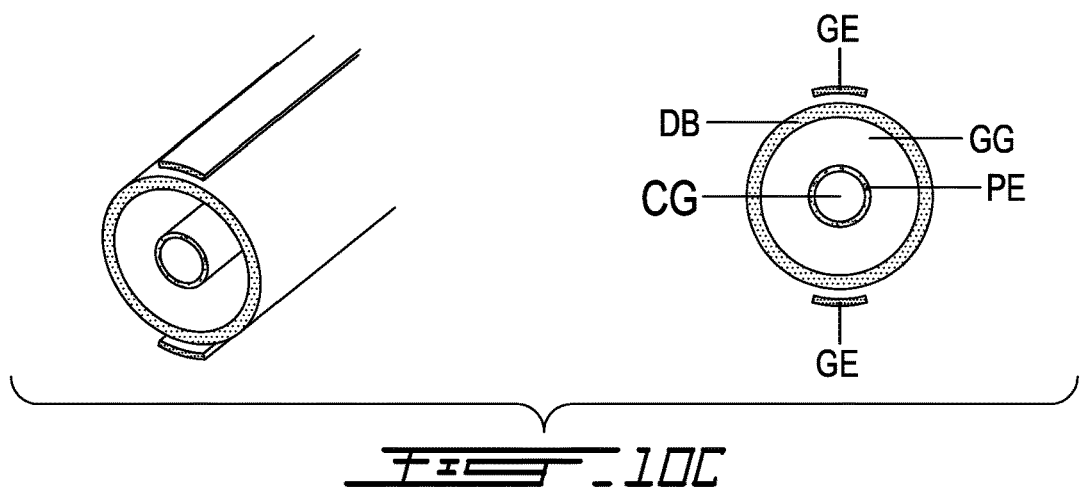
FIG. 10C shows a plasma geometry according to an embodiment of an aspect of the present invention.

Moreover, in the examples illustrated herein, the plasma source is shown in a coaxial geometry: the powered electrode (PE) is a hollow electrode centered within the external hollow grounded electrode as the grounded electrode (GE). Alternative geometries may be contemplated, such as square (FIG. 10A), plane-to-plane (FIG. 10B), the gas gap (GG) being formed using a gas guide (Gg), or curved plane to plane (FIG. 10C) geometries for example, with a gas gap (GG) between the central electrode (PE) and the dielectric barrier (DB) having a constant thickness.

Figure 1:
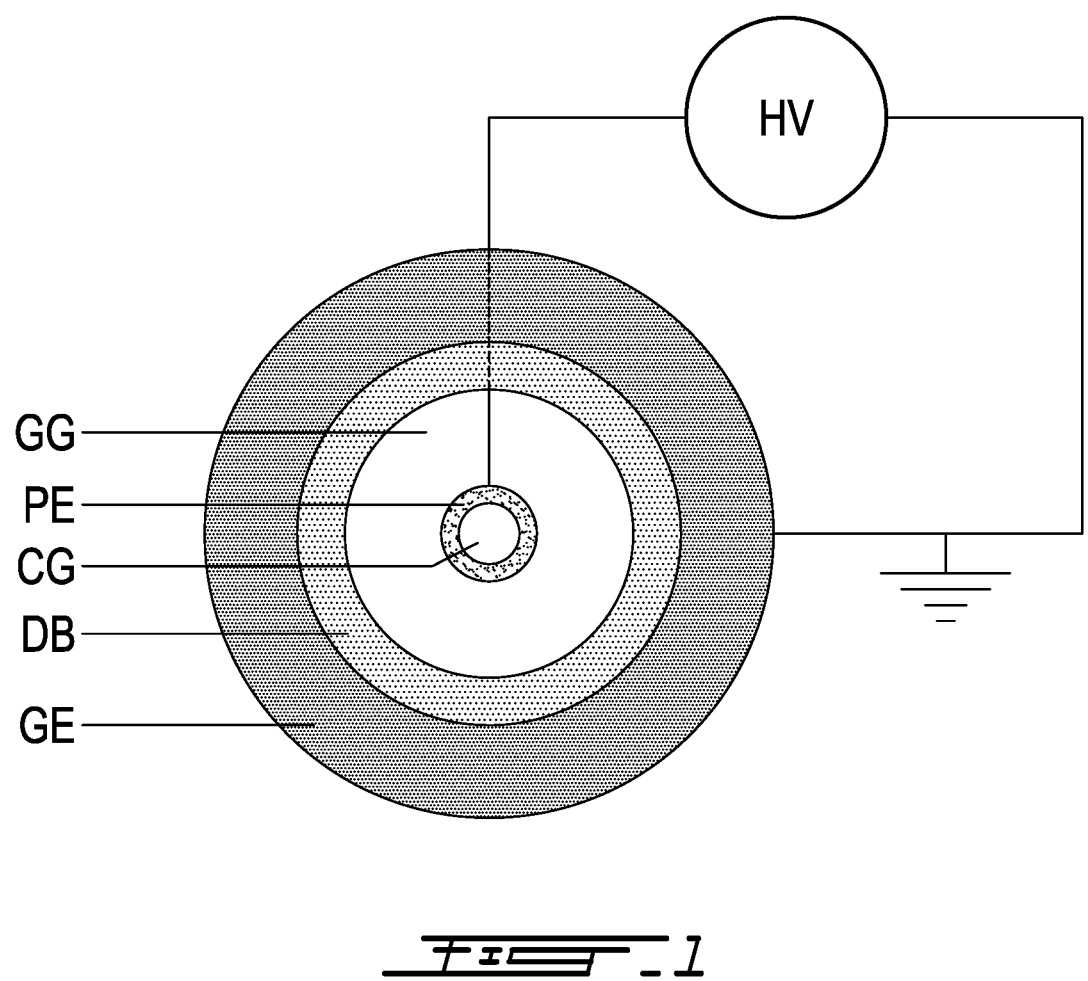
FIG. 1 is a schematic of a circuit of plasma source according to an embodiment of an aspect of the present disclosure.

FIG. 1 is a transverse cross section of a plasma source according to an embodiment of an aspect of the present disclosure.

The central hollow electrode (PE) is powered to ignite a discharge. In the examples herein, a voltage of sinusoidal waveform is used, at a frequency in a range between about 5 MHz and about 20 MHz, for example at a frequency of 13.56 MHz. Other excitation waveforms such as square, triangle and sawtooth shapes for example, may be used and frequency may be selected in the range between about 100 Hz and about 100 MHz, with different discharge dynamics and different produced plasma properties, while still allowing sustaining discharges in the plasma source configurations described hereinbelow. Frequencies beyond the range between about 100 Hz and about 100 MHz may also be considered; the plasma source operates at a plasma power density in a range between 0.1 W/cm$^3$ and 500 W/cm$^3$.

According to an embodiment of an aspect of present disclosure, in a first configuration, a plasma-forming gas (G) is injected into the gas gap (GG) formed between the central electrode (PE) and the dielectric barrier (DB), and a non-plasma-forming gas (NG) is injected into the central gap (CG) of the central electrode (PE).

A source of reactive species (R), such as $N_2$, $O_2$, air, gaseous chemical compounds, vapour and an aerosol, may be injected into the gas gap (GG) formed between the central electrode (PE) and the dielectric barrier (DB) together with the plasma-forming gas (G) and/or into the central electrode (PE) together with the non-plasma-forming gas (NG) (see FIGS. 2A, 2D), in order to selectively generate reactive species in the flowing afterglow (FA) or in the effluent zone (RZ).

The non-plasma-forming gas (NG) may be a source of reactive species (R); in such case, concentration of the plasma non-forming gas (NG) may be increased by pulsing the plasma-forming gas (G). For example, as shown in FIG. 6 discussed hereinbelow for example, the plasma turns on and off depending on whether or not the plasma-forming gas is present in the gas gap (GG) or not. In this particular case, the non-plasma forming gas (NG) being ambient air, as soon as the flow the plasma-forming gas (G) is cut off, the non-plasma forming gas (NG) fills the entire plasma source and the plasma is extinguished.

In this first configuration, using the plasma source of FIG. 1 powered with a 13.56 MHz sinusoidal excitation waveform, the plasma-forming zone forms in the gas gap (GG) formed between the central electrode (PE) and the dielectric barrier (DB), and the plasma (P) produces reactive species that are blown downstream to the exit and outward of the plasma source (see arrow in FIG. 2D) by gas entrainment. At a feeding power significantly higher than the minimum power necessary to initiate a discharge, depending on the nature of the plasma-forming gas and of the flux and concentration of the non-plasma-forming gas (NG), in a first mode (γ mode discussed hereinbelow), a reactive flowing afterglow (FA), in which the energy supplied by the applied electric field does not contribute significantly to the production of reactive species, is observed at the exit of the plasma source. The reactive flowing afterglow (FA) ends up into a non-fluorescent effluent reactive zone (RZ). In this first mode, the large plasma volume produced in the gas gap (GG) formed between the central electrode (PE) and the dielectric barrier (DB) within the plasma source thus generates reactive species that are transported to the outside of the plasma source to a reactive zone including the reactive fluorescent reactive flowing afterglow (FA) and the non-fluorescent effluent reactive zone (RZ), which may be used for treatment for example, as will be discussed hereinbelow. In a second mode (Ω mode discussed hereinbelow), obtained at a feeding power about the minimum power to initiate a discharge, no flowing afterglow (FA) is observable but reactive species are produced at the output of the plasma source, in a non-fluorescent effluent reactive zone (RZ).

In a second configuration, the plasma-forming gas (G) is injected within the central gap (CG) inside the central electrode (PE) and the non-plasma-forming gas (NG) is injected into the gas gap (GG) between the central electrode (PE) and the dielectric barrier (DB).

A source of reactive species (R), such as $N_2$, $O_2$, air, gaseous chemical compounds, vapour and an aerosol, may be injected into the gas gap (GG) formed between the central electrode (PE) and the dielectric barrier (DB) with the non-plasma-forming gas (NG), and/or into the central gap (CG) together with the plasma-forming gas (G) (FIGS. 2C and 2F), in order to selectively generate reactive species in the flowing afterglow (FA) or in the effluent zone (RZ).

Figure 2A:
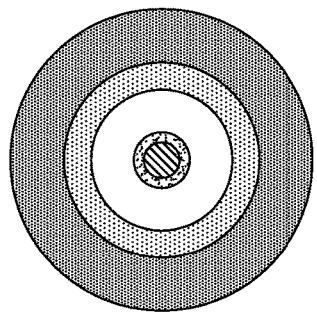
FIG. 2A is a schematic cross-sectional view of the plasma source of FIG. 1 in operation in a first configuration according to an embodiment of an aspect of the present disclosure.
Figure 2B:
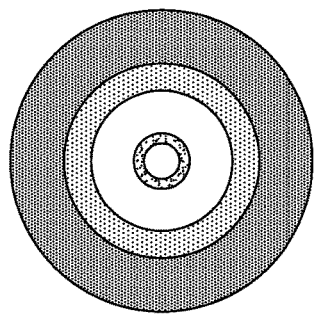
FIG. 2B is a schematic cross-sectional view of the plasma source of FIG. 1 according to an embodiment of an aspect of the present disclosure.
Figure 2C:
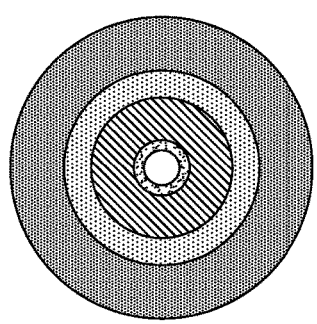
FIG. 2C is a schematic cross-sectional view of the plasma source of FIG. 1 in operation in a second configuration according to an embodiment of an aspect of the present disclosure.
Figure 2D:
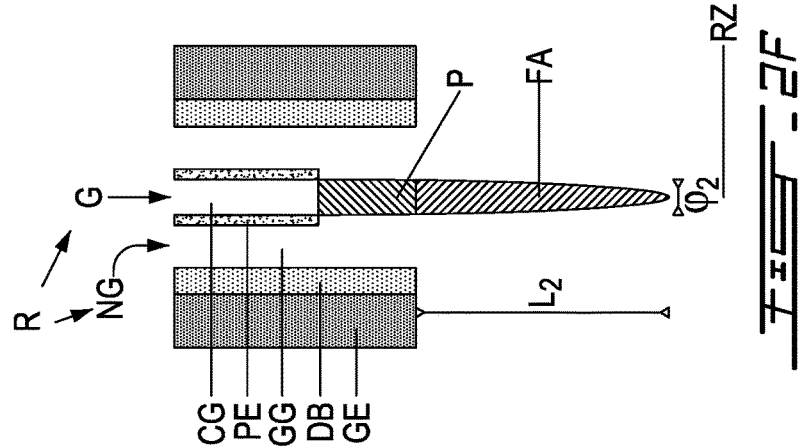
FIG. 2D is a schematic longitudinally sectioned view of the plasma source of FIG. 1 in operation in the first configuration of FIG. 2A.
Figure 2E:
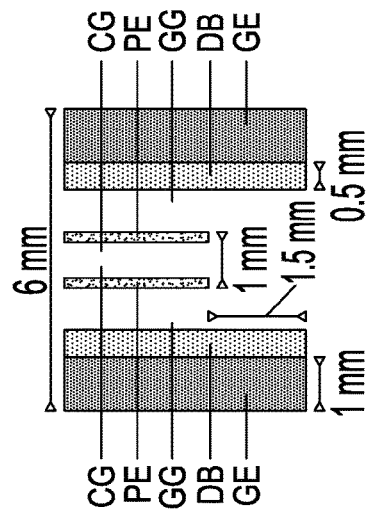
FIG. 2E is a schematic longitudinally sectioned view of the plasma source of FIG. 1.
Figure 2F:
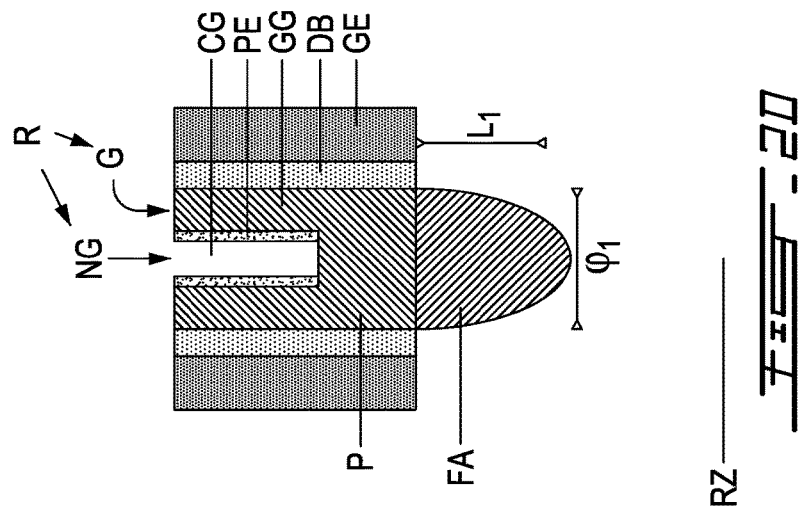
FIG. 2F is a schematic longitudinally sectioned view of the plasma source of FIG. 1 in operation in the second configuration of FIG. 2C.

Thus set in the second configuration (FIGS. 2C, 2F), the plasma source of FIG. 1 powered with a 13.56 MHz sinusoidal excitation waveform, in contrast to when set in the first configuration (FIGS. 2A, 2D) in which the plasma is generated in the gas gap (GG) between the central electrode (PE) and the dielectric barrier (DB), produces plasma (P) in a jet mode at the outlet of the central electrode (PE) and concentrated along the longitudinal axis of the plasma source, as shown in FIG. 2F.

Figure 3A:
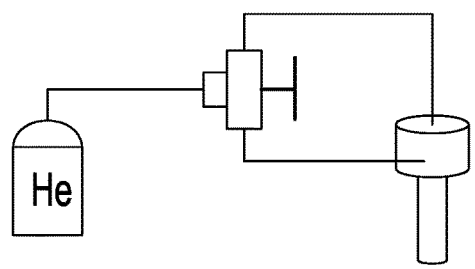
FIG. 3A is a schematic view of a gas feeding unit according to an embodiment of an aspect of the present disclosure.

According to an embodiment of an aspect of the present disclosure, a gas feeding unit is used to selectively enable the first configuration or the second configuration, by controlling injection of the plasma-forming gas (G) within the first electrode or within the gas gap (GG) between the first electrode and the dielectric barrier (DB), while controlling injection of the non-plasma-forming gas (NG) into the first electrode or into the gas gap (GG) between the first electrode and the dielectric barrier (DB). FIG. 3A shows a gas feeding unit for generating plasma using helium as the plasma-forming gas (G) and ambient air as the non-plasma-forming gas (NG) according to an embodiment of an aspect of the present disclosure. A helium cylinder (He) is connected to the plasma source through a three-way valve for example, with a first position of the three-way valve directing helium in the gas gap (GG) of the plasma source while allowing ambient air to fill the first electrode (PE), hence setting the plasma source into the first configuration. A second position of the three-way valve directing helium in the first electrode (PE) while allowing ambient air to fill the gas gap (GG) of the plasma source, hence setting the plasma source into the second configuration.

Figure 3B:
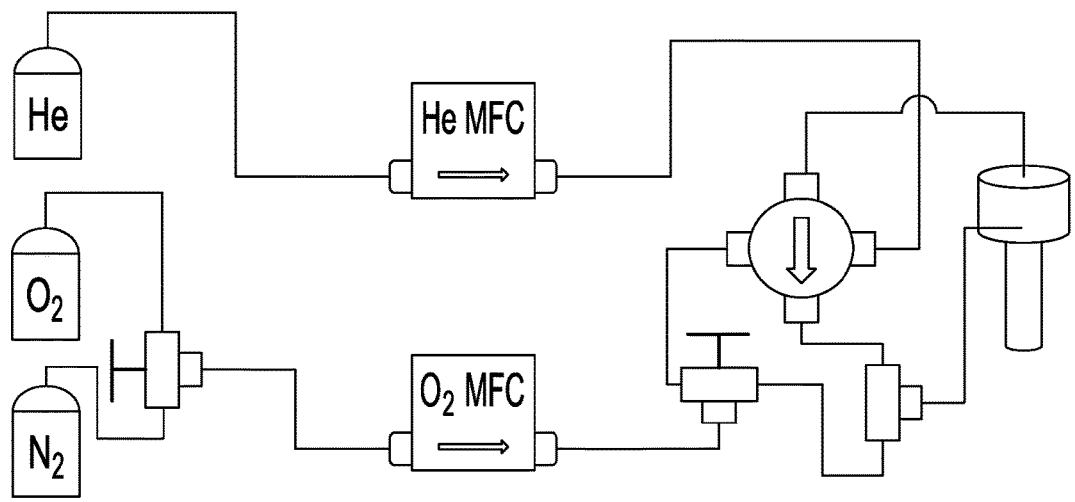
FIG. 3B is a schematic view of a gas feeding unit according to an embodiment of an aspect of the present disclosure.

A gas feeding unit is illustrated in FIG. 3B using helium as the plasma-forming gas (G) and $O_2$ as the non-plasma-forming gas (NG), comprises a ball valve for example, the helium feeding line and the $O_2$ feeding line, with MFC standing for mass flow controller, being connected to a gas input of the ball valve. The ball valve may be operated to direct either gas to either the gap (CG) of the first electrode (PE) or the gas gap (GG) between the first electrode (PE) and the dielectric barrier (DB).

Figure 3C:
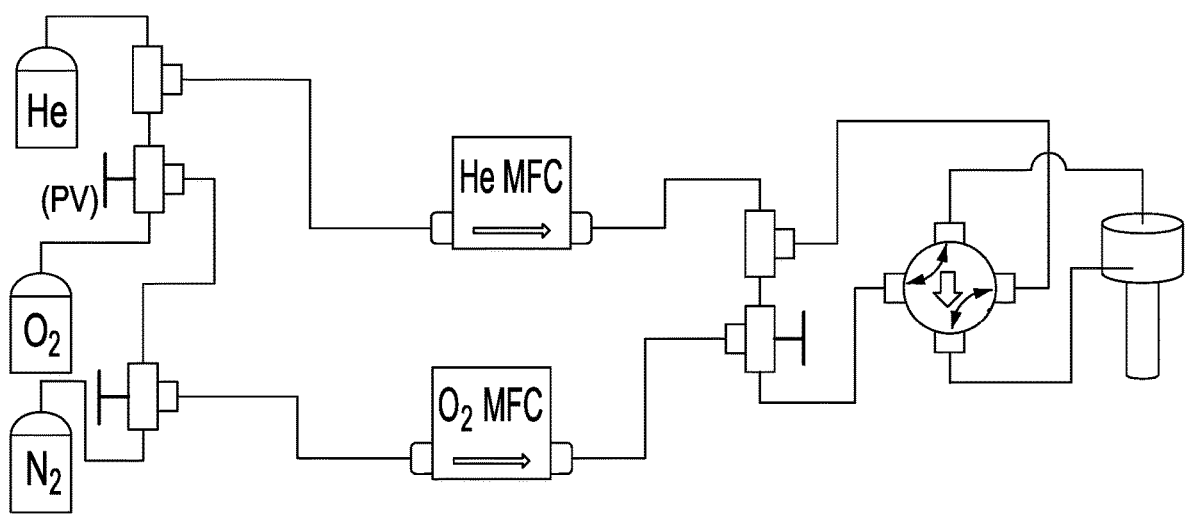
FIG. 3C is a schematic view of a gas feeding unit according to an embodiment of an aspect of the present disclosure.

FIG. 3C is a schematic view of a gas feeding unit for selective injection of helium as the plasma-forming gas (G) and $N_2$ or $O_2$ as the non-plasma-forming gas (NG) for example. A first three-way valve for example allows selectively injecting $O_2$ or $N_2$ either separate from helium or mixed with helium, or not injecting $O_2/N_2$; a four-way crossover valve for example is used to direct the plasma-forming (G) to the first electrode (PE) and the non-plasma-forming gas (NG) to the gas gap (GG) between the first electrode (PE) and the second electrode (GE) or vice-versa; a second three-way valve for example is used to select the non-plasma forming gas: either $O_2$, $N_2$, or none (i.e. ambient air); and a third three-way valve for example allows passing helium through the whole gas feeding unit to purge the lines of $O_2$ and $N_2$ when switching the configuration of the plasma source.

A method according to an embodiment of an aspect of the present disclosure comprises selecting a non plasma-forming gas (NG) and a plasma-forming gas (G) having a lower breakdown voltage than the non plasma-forming gas (NG); having the plasma-forming gas (G) and the non-plasma-forming gas (NG) flow within a first electrode separated from a second electrode by a gas gap (GG) and a dielectric barrier (DB) of constant thickness, selecting which of the plasma-forming gas (G) or the non-plasma-forming gas (NG) to flow in the first electrode at a given time; and initiating a discharge.

When operating in ambient air, stagnant ambient air may be used as either the plasma-forming gas or the non-plasma-forming gas.

A carrier of reactive species (R) gas may further be selected, and injected with at least one of: i) the plasma-forming gas (G), and ii) the non-plasma-forming gas (NG), in order to selectively generate reactive species in the flowing afterglow (FA) or in the effluent zone (RZ).

Either gas may be a gas combination, including pre-mixed gases, chemical precursors, steam and water for example.

Experiments were performed using helium, as the plasma-forming gas (G), and air, molecular oxygen ($O_2$) or molecular nitrogen ($N_2$) as the non-plasma-forming (NG) gases. The gas combinations tested were He-Air, He—$O_2$, and He—$N_2$. Other combinations of gases such as He—Ar, He—Ne, Ne—Ar, Ne-Air, Ne—$O_2$, Ne—$N_2$, Ar-Air, Ar—$O_2$, and Ar—$N_2$ for example may be used, as well as combinations including pre-mixed gases, chemical precursors, steam and water for example. Experiments were performed using molecular oxygen ($O_2$) or molecular nitrogen ($N_2$) as a source of reactive species (R), with helium as the plasma-forming gas (G) and ambient air as the non-plasma-forming gas (NG).

In the experiments, a 316 stainless steel tube with inside and outside diameters of 4 mm and 6 mm was used as the external electrode (GE), the dielectric barrier (DB) was a fused silica tube with inside and outside diameters 3 mm and 4 mm, and the central electrode (PE) was a stainless steel needle with inside and outside diameters 0.686 mm and 1.067 mm (see FIGS. 2B and 2E). A needle with inside and outside diameters 0.4064 mm or 1.1938 mm and 0.7112 or 1.615 mm respectively could also be used with these geometries.

With the plasma source of FIG. 1, for a plasma of a length $L_2$ of 5 mm and a diameter $\phi_2$ of 1 mm, it was found that the relative diameters of the central electrode 14 and the external electrode 18 were to be selected so that the gas gap therebetween allows maintaining a quasi-uniform electric field between the electrodes, and thus maintaining a $\Omega$ mode in the internal configuration. In the present example (FIG. 2), the outside diameter of the central electrode 14 is thus selected of at most about 2.8 mm so that the gas gap is at least about 100 micrometers to allow initiation of the plasma.

As schematically shown in FIG. 2E for example, the central electrode (PE) was selected to be slightly shorter, by about 1.5 mm, than the external electrode (GE) so that the local electrical field was sufficiently intense to produce a plasma volume (P) at the outlet of the plasma source in the second configuration. In case of a shorter central electrode (PE), the effluents of the reactive zone (RZ), the flowing afterglow (FA) or the plasma (P) may not reach the exit of the external electrode (GE) to a target treatment zone for example. A plasma may be initiated with a longer central electrode (PE); in such case, the shape of the electric field in the second configuration may shift towards the shape of the electric field of a corona discharge for example, and yields different characteristics such as the electron density and energy. Provided the discharge is not in the $\gamma$ mode, the shape of the electric field applied between the two electrodes is essentially uniform between the central electrode (PE) and the external electrode (GE), with a slight accentuation at the end of the central electrode (PE).

The method comprises selecting an applied power, gases and flow of the selected gases according to target plasma volume, distribution and properties.

The first configuration may be selected, in which the plasma-forming gas (G) is injected in the gas gap (GG) between the central electrode (PE) and the external electrode (GE), and the non-plasma-forming gas (NG) is injected into the central gap (CG), using for example the gas feeding unit of FIG. 3A.

In the present examples, when the plasma-forming gas is helium and the voltage applied to the central electrode (PE) is close to a minimum voltage to maintain a discharge, a plasma is generated in the $\Omega$ mode, characterized by radially uniform electric field and visible optical emission in the gas gap (GG) between the central electrode (PE) and the external electrode (GE). The $\Omega$ mode may be maintained at room temperature without requiring a cooling system or method. The reactive species produced in the reactive zone (RZ) can be used to directly treat a liquid, a surface or a substrate including biological liquids, surfaces, cells, tissues and substrates for example.

Figures 4A, 4B:
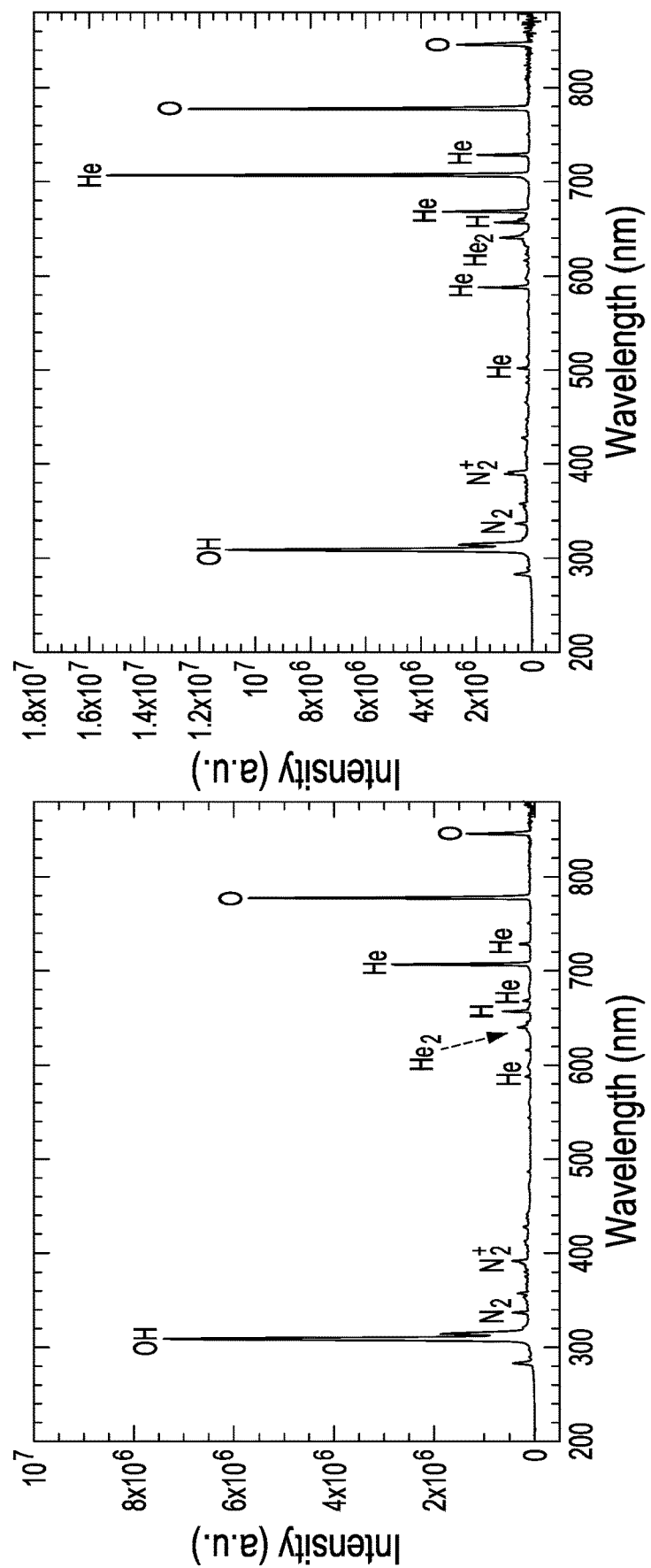
FIG. 4A shows an optical emission spectrum of the plasma in the first configuration in the $\Omega$ mode, with 4.3 slm of helium and 10 W of power at the generator.
FIG. 4B shows an optical emission spectra of the plasma in the first configuration in the $\gamma$ mode, with 4.3 slm of helium and 35 W at the generator.

When the applied power is significantly greater than the threshold power required to reach the minimum breakdown voltage, for example in case of helium twice as large, the discharge can be sustained in the $\gamma$ mode, characterized by radially inhomogeneous electric field and visual optical emission in the gas gap (GG) between the central electrode (PE) and the external electrode (PE) typically, the electric field intensity increase towards the central electrode (CR) and as more electrons have sufficient energy to excite helium atoms in radiative states, the optical emission shifts (from purple to pinkish) as may be seen quantitatively in FIG. 4B versus FIG. 4A. The $\gamma$ mode is more energetic than the $\Omega$ mode and gives rise to a flowing afterglow (FA) at the outlet of the plasma source, which can be used to directly treat a liquid, a surface or a substrate including biological liquids, surfaces, cells, tissues and substrates for example.

The gas temperature may be controlled close to the ambient temperature by modulating the applied power according to a fast cycle, of an ON/OFF type with adjustable duty cycle. The duty cycle can be varied from 1 to 99%, depending on the combination of the excitation frequency and the modulation frequency. Values of the modulation frequency in a range between about 1 Hz and about 30 kHz were efficiently tested; a wider range may be used. Above about 1 kHz, the plasma reignition may be affected by the previous modulation cycle memory effect.

In the first configuration, regardless of whether the discharge is in the $\Omega$ or in the $\gamma$ mode, a source of reactive species (R) may be injected within the plasma-forming gas (G), within the non-plasma-forming gas (NG) or within both the plasma-forming gas (G) and the non-plasma-forming gas (NG) in order to selectively generate reactive species in the flowing afterglow (FA) or in the effluent zone (RZ).

The first configuration allows treatment over a large area. For example the flowing afterglow (FA) or the effluent zone (RZ), i.e. the treatment area, with the plasma source of FIG. 1, has a diameter $\phi_1$ of 3 mm. In the first configuration, the flowing afterglow (FA) may have a length $L_1$ of about 3 mm (see FIG. 2D).

In the second configuration, the plasma-forming gas (G) is injected into the central gap (CG), and the non-plasma-forming gas (NG) is injected, or the ambient air naturally fills the space, between the central electrode (PE) and the dielectric barrier (DB), thus in the gas gap (GG) (see FIG. 2F).

Should the applied power be high enough to sustain a voltage high enough to allow breakdown of the plasma-forming gas (G), but low enough not to breakdown the non-plasma-forming gas (NG), no plasma volume is generated in the gas gap (GG) between the dielectric barrier (DB) and the central electrode (PE). In contrast, the zone of simultaneous presence of the plasma-forming gas (G) and the electric field at the outer end of the central electrode (PE) contains a plasma volume (P). Since this plasma volume is small, the dissipated power density may be high in the second configuration and the gas temperature remains close to ambient temperature. As a result, there is no need for a cooling system or method, such as a modulation frequency with a duty cycle under 100% as described hereinabove.

Indeed, since, at constant power, the gases entering the plasma source is at about ambient temperature, heating of the gases is a function of the time spent within the plasma source. Considering parameters used herein, a sample of gas passes approximately 3 times more time in the plasma (P) in the first configuration than in the second configuration, and thus heating of the gas is increased in the first configuration compared to the second configuration. On the cooling side, the larger the surface of the plasma in contact with a cold source, such as the ambient air, directly or through a wall of the plasma source, hence the larger this contacting surface versus the plasma volume, the more effective the cooling. Considering the parameters illustrated herein, the surface/volume ratio is about 2 times larger in the second configuration than in the first configuration.

In the second configuration, the non-plasma-forming gas (NG), injected in the gas gap (GG) between the dielectric barrier (DB) and the central electrode (PE) may be selected to optimize target reactive species or to isolate the generated plasma volume from the ambient air.

In the second configuration, a source of reactive species (R) can be injected within the plasma-forming gas (G) as an admixture or within the non-plasma-forming gas (NG) or both.

In the example of FIG. 1, in the second configuration, the plasma may have a length $L_2$ of 5 mm and a diameter $\phi_2$ of 1 mm (see FIG. 2F).

It was found that the relative diameters of the central electrode (PE) and of the external electrode (GE) are to be selected so that the gas gap (GG) maintains a quasi-uniform electric field between the electrodes, and thus maintains a Ω mode in the first configuration. In the present example (FIG. 2), the outside diameter of the central electrode (PE) is thus selected of at most about 2.8 mm so that the gas gap (GG) is at least about 100 μm to allow initiation of a plasma.

Thus, the present method comprises selecting at least two gases, which may be steam or ambient air or other gases, of different breakdown voltages and injecting at least a first gas in a first electrode separated from a second electrode by a gas gap of a constant width, and injecting a second gas in the gas gap.

Observed with the naked eye, a camera or a spectrometer, the geometry, the intensity and the dominant wavelength of the produced emission depends on whether the plasma source operates in the first or in the second configuration. Optical emission spectroscopy results show that the atomic and molecular transitions as well as their intensities are different, in the range between 200 and 880 nm (see FIG. 4), in the first and in the second configuration, due to different nature, density and energy of the fundamental components of the generated plasma and effluents.

Figure 4C:
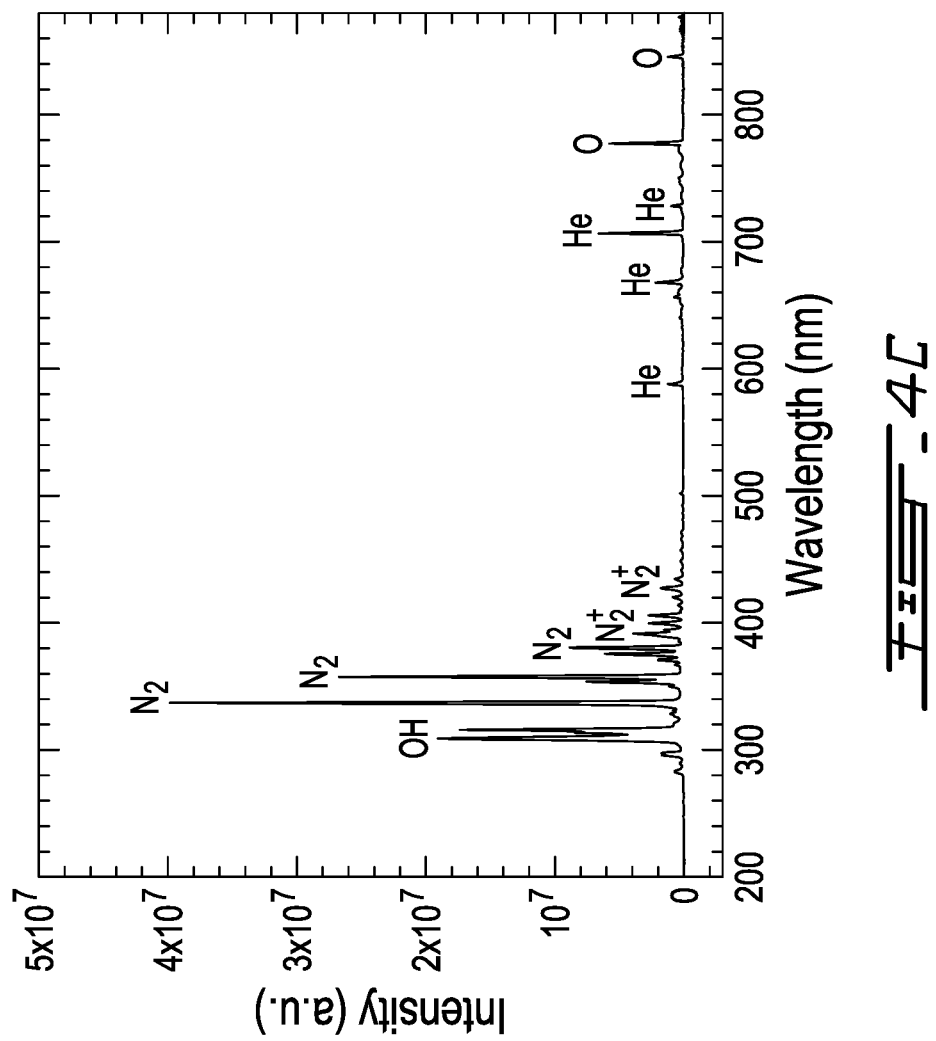
FIG. 4C shows an optical emission spectrum of the plasma in the second configuration, with 0.6 slm of helium and 35 W at the generator.

As can be seen in FIGS. 4, a device according to an aspect of the present disclosure generates different optical emission spectra depending on its operating configuration. In a first configuration, the dominant emissions in the Ω mode are the OH molecular emission (band head wavelength near 306 nm) and the helium and oxygen atomic line emissions (centre wavelength near 706 nm and 777 nm respectively) (FIG. 4A). In the γ mode, the He line (centre wavelength near 706 nm) becomes the dominant emission and all other helium emissions increase preferentially (FIG. 4B). In a second configuration, as opposed to the Ω and γ modes, $N_2$ molecular emissions (band head wavelength near 337 nm) dominate the spectrum (FIG. 4C). From the first configuration to the second configuration, the He line ratios (centre wavelength at 587 nm over centre wavelength at 706 nm and center wavelength at 668 nm over the centre wavelength at 728 nm) increase. In atmospheric-pressure low-temperature helium discharges, these line ratios being good indicators of electron energy, the electron energy is expected to increase from the Ω mode (first configuration) to the γ mode (first configuration) to the second configuration, as illustrated in Table 1 below.

TABLE 1

Helium line ratios within the different plasmas as an indicator of electron energy

|  | First configuration (Ω mode) | First configuration (γ mode) | Second configuration |
|---|---|---|---|
| He(587 nm)/He(706 nm) | 0.03 | 0.10 | 0.15 |
| He(668 nm)/He(728 nm) | 0.6 | 1.6 | 2.0 |

FIG. 5 shows the influence of the flow of $O_2$ on the optical emissions of the discharge in the γ mode (first configuration) with an applied power of 25 W and a helium gas flow rate of 4.3 slm in the gas gap (GG) between the central electrode (PE) and the external electrode (GE). The optical emission of atomic oxygen (centre wavelength at 777 nm) is also shown. As can be seen from FIG. 5A, injection of $O_2$ with the plasma-forming gas G within the gap (GG) between the central electrode (PE) and the external electrode (GE) maximizes the intensity of oxygen lines emission in comparison with injection of $O_2$ in the central gap (CG). In contrast, other emissions, for instance He, are less intense in case of injection of $O_2$ with the plasma-forming gas (G). In the case of injection of $O_2$ in the central gap (CG), FIG. 5B shows that the only variation of He and O lines occurs between 0 and 0.002 slm where both emissions are reduced. In the case of injection in the gas gap (GG) between the central electrode (PE) and the external electrode (GE), between 0 and 0.002 slm, the O line increases while the He line decreases, then above 0.002 slm, both lines decrease. This suggests that the production of atomic oxygen is maximized for small amount of $O_2$ injection with the plasma-forming gas (G).

As discussed hereinabove, the respective length of each electrode is selected to be large enough to generate a plasma afterglow and effluents in a configuration in which the plasma-forming gas (G) is injected in the gas gap (GG) between the dielectric barrier (DB) and the central electrode (PE), and the non-plasma-forming gas (NG) is injected, or the naturally present ambient air flows, within the central gap (CG) (first configuration see FIG. 2D). For example, a length between about 1 cm and about 1 m may be selected for the external electrode (GE).

The length of the central electrode (PE) is selected to be slightly shorter than the length of the external electrode (GE), for the electric field to be sufficient to produce and maintain a plasma volume in a configuration in which the non-plasma-forming gas (NG) is injected in the gas gap (GG) between the dielectric barrier (DB) and the central electrode (PE) (second configuration, FIG. 2F).

The present method allows generating plasma volumes in all configurations of the plasma source. If a static volume of gas is filling the plasma source without any gas flow, a plasma in the first configuration can be ignited using sufficient applied power. No non-plasma-forming gas is required to sustain a plasma in the first configuration. In order to select the second configuration, in case the non-plasmaforming gas in the gas gap (GG) is a static volume, a minimum plasma-forming gas flow, for example of at least 0.1 slm, is fed in the central electrode (PE).

Helium was used as a plasma-forming gas (G), in conjunction with ambient air or diatomic oxygen or diatomic nitrogen injection in both configurations. In all configurations, an applied power between about 10 W and about 50 W was used, which corresponds to a maximum of about 10 W injected into the plasma (P) in the first configuration (FIG. 2A).

Figures 6A, 6B:
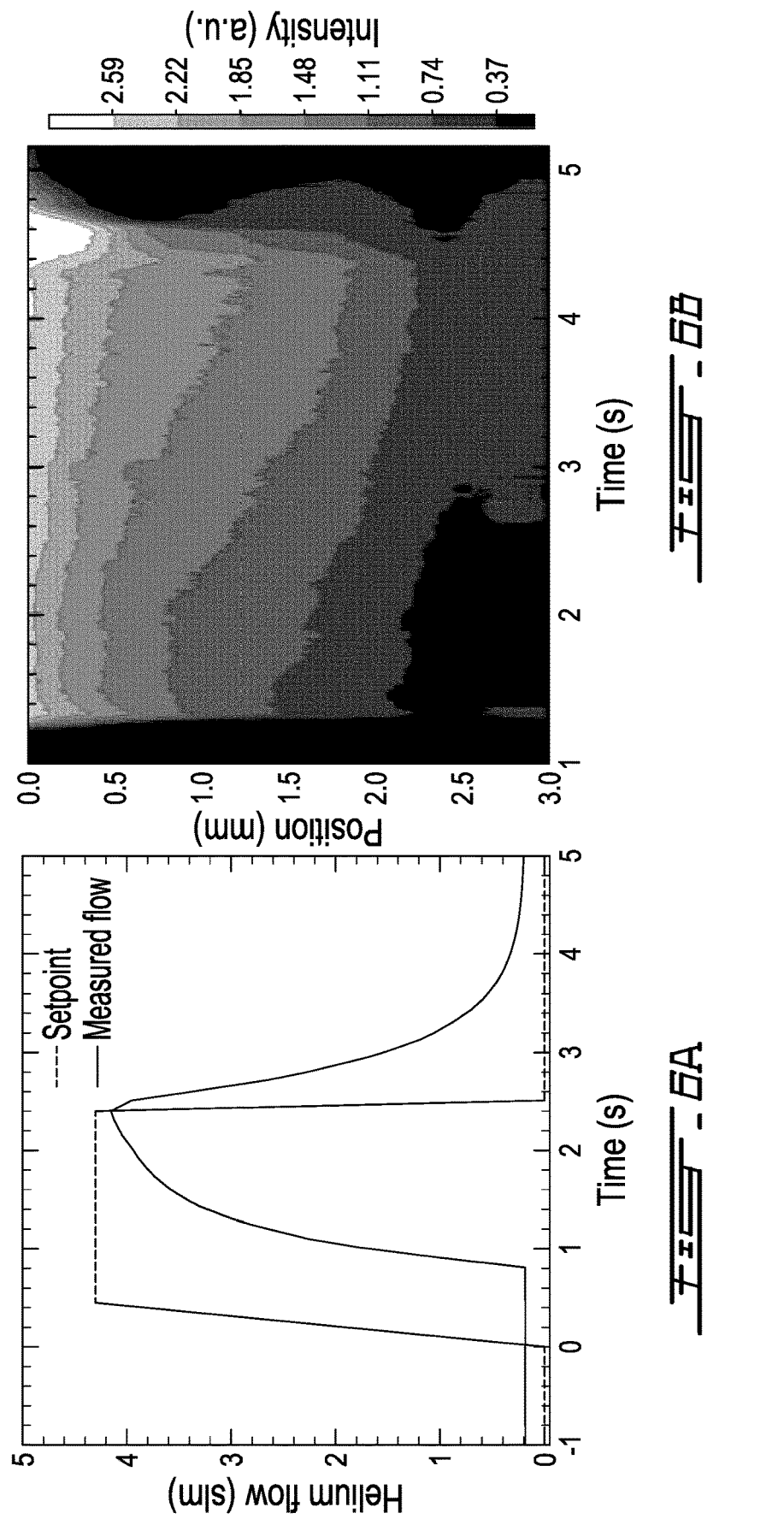
FIG. 6A shows an example of pulsed gas flow to control plasma ignition, in the first configuration, the helium flow rate being set at 4.3 slm during 2 s and the power at the generator being set at 35 W.
FIG. 6B shows the visible light emission along the axis of the gas flow during a plasma ignition controlled by a gas pulse. The prototype is set in the first configuration, the helium flow rate is set at 4.3 slm during 2 s and the power at the generator is set at 35 W.

FIG. 6 shows that a pulse of plasma-forming gas (G) can be used to control the ignition of the discharge. FIG. 6A illustrates the profile of the gas flow when helium is set to a maximum of 4.3 slm for 2 s. In the first configuration with an applied power of 35 W, a transient γ mode is sustained. FIG. 6B shows the evolution of the visible light emission during such a gas pulse. Light emission is found to be maximum before the extinction of the discharge. Using a pulse of plasma-forming gas allows to maximize the interaction between ambient air, the source of reactive species and the plasma-forming gas as ambient air is mixed in high concentration during the ignition and the extinction of the discharge.

In the present method, selectively controlling the geometry and position of the central electrode and of the external electrode, and selectively controlling the injection of a plasma-forming gas and a non-plasma-forming gas, with the selected electrodes geometry and electrodes positions and selected other parameters, including gas flow rate, gases composition, applied power, excitation waveform, excitation frequency or repetition frequency, duty cycle, allows different configurations of plasma generation. Each configuration generates a plasma characterized by a specific volume, distribution and properties. A source of reactive species may also be injected within the plasma-forming gas or within the non-plasma-forming gas for further controllability.

A plasma source of the present disclosure was used for the treatment of various cancer cell lines: breast cancer cell lines such as MDA-MB-231, MDA-MB-436, BT747, MCF7 and HCC1143 and soft tissue sarcoma cell lines, such as STS117 and STS109, for example. FIGS. 7 to 9 shows example of in vitro treatments.

Figures 7A, 7B, 7C:
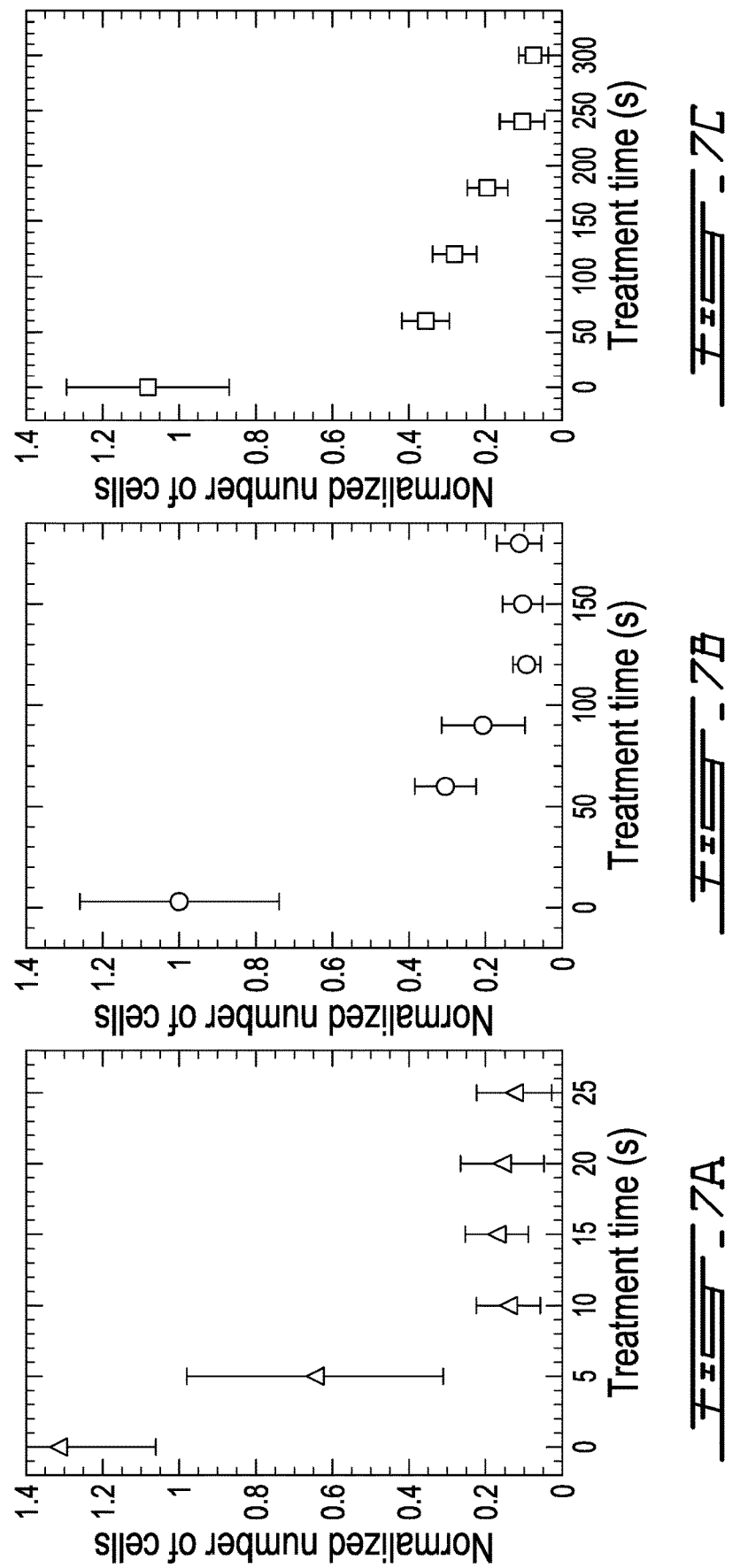
FIG. 7A shows the normalized cell number 6 days after exposure of MDA-MB-231 cell line in suspension in 400 µl DMEM within 1.5 ml microtube to the plasma in the first configuration in a Ω mode; the helium flow rate is 4.3 slm, the power at the generator is 10 W and the distance from the tip of the nozzle to the liquid surface is 5 mm.
FIG. 7B shows the normalized cell number 6 days after exposure of MDA-MB-231 cell line in suspension in 400 µl DMEM within 1.5 ml microtube to the plasma in the first configuration, in a γ mode; the helium flow rate is 4.3 slm, the power at the generator is 20 W and the distance from the tip of the nozzle to the liquid surface is 5 mm.
FIG. 7C shows the normalized cell number 6 days after exposure of MDA-MB-231 cell line in suspension in 400 µl DMEM within 1.5 ml microtube to the plasma in the second configuration, in a jet mode; the helium flow rate is 0.6 slm, the power at the generator is 35 W and the distance from the tip of the nozzle to the liquid surface is 5 mm.
Figure 8:
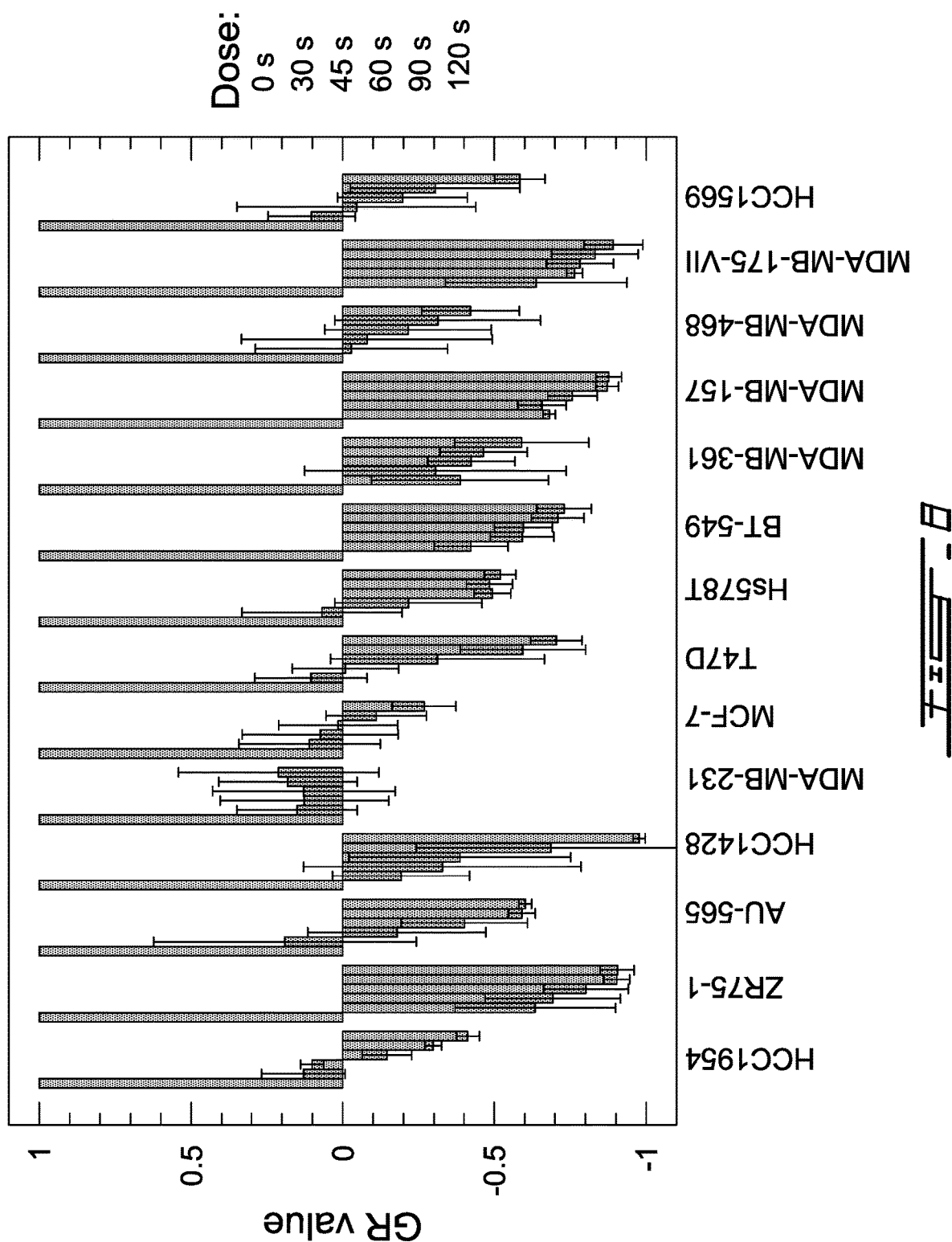
FIG. 8 shows growth rate inhibition (GR) values 6 days after exposure of different cell lines in suspension in 400 µl DMEM within 1.5 ml microtube to the plasma in the second configuration, in the jet mode; the helium flow rate is 0.6 slm, the power at the generator is 35 W and the distance from the tip of the nozzle to the liquid surface is 5 mm.

FIG. 7A shows the normalized cell number 6 days after exposure of MDA-MB-231 cell line in suspension in 400 µl DMEM within 1.5 ml microtube to the plasma in the first configuration. The helium flow rate is 4.3 slm, the power at the generator is 10 W and the distance from the tip of the nozzle to the liquid surface is 5 mm.

FIG. 7B shows the normalized cell number 6 days after exposure of MDA-MB-231 cell line in suspension in 400 µl DMEM within 1.5 ml microtube to the plasma in the first configuration. The helium flow rate is 4.3 slm, the power at the generator is 20 W and the distance from the tip of the nozzle to the liquid surface is 5 mm.

FIG. 7C shows the normalized cell number 6 days after exposure of MDA-MB-231 cell line in suspension in 400 µl DMEM within 1.5 ml microtube to the plasma in the second configuration. The helium flow rate is 0.6 slm, the power at the generator is 35 W and the distance from the tip of the nozzle to the liquid surface is 5 mm.

From the dose-response curves of cells treated in suspension of FIG. 7, it is possible to observe that all three discharge modes provide an anti-proliferative capacity up to 90%; more time is required to reach the same anti-proliferative capacity in the γ mode and the Ω mode (first second configuration) than in the jet mode (the second configuration). This suggests that the jet mode produces more cytotoxic reactive species or produce them in higher concentration for action on cells in suspension.

FIG. 8 shows dose-response curves obtained using the growth rate inhibition (GR) values which are based on the ratio of growth rates in the presence and absence of perturbagen GR inhibition values may be calculated using to the following relation:

$$GR(c) = 2^{\frac{\log_2(x(c)/x_0)}{\log_2(x_{ctl}/x_0)}} - 1$$

With x(c) the cell number of the treated sample at concentration c, $x_0$ the cell number at the time t=0 s Immediately at the time of treatment, $x_{ctl}$ the cell number of the control sample at the same time as x(c).

In FIG. 8, doses increase from left to right from 0 s to 120 s. From FIG. 8, it is clear that the same dose of non-thermal plasma results in different cytotoxic effects on various cell lines. For example, MDA-MB-231 and MDA-MB-361 have a relatively low influence of the dose of non-thermal plasma. However, the treatment has a very different anti-proliferative effect on both cell lines, MDA-MB-231 weakly respond while MDA-MB-361 strongly response. On the opposite, cell lines such as T47D and HCC1569 are strongly dependent on the dose with a weak response at 30 s and a strong response at 120 s. The fact that cell lines show a wide variety of response to the same treatment indicates the benefit of a highly tunable plasma source that allows different properties adjustable to different targets.

FIG. 9A shows fluorescence microscopy images of the cells with propidium iodide staining immediately after treatment with the first configuration in Ω mode with MDA-MB-231 cell line at the bottom of a petri dish at 5 mm from the end of the nozzle, power at the generator is 10 W and 4.3 slm of nominally pure helium is injected as the plasma-forming gas (G) versus 4.3 slm nominally pure helium only (G) without power.

FIG. 9B shows fluorescence microscopy images of the cells with propidium iodide staining immediately after treatment with the first configuration in γ mode with MDA-MB-231 cell line at the bottom of a petri dish at 5 mm from the end of the nozzle, power at the generator is 35 W and 4.3 slm of nominally pure helium is injected as a plasma-forming gas (G) versus 4.3 slm nominally pure helium only (G) without power.

FIG. 9C shows fluorescence microscopy images of the cells with propidium iodide staining immediately after treatment with the second configuration with MDA-MB-231 cell line at the bottom of a Petri dish at 5 mm from the end of the nozzle, power at the generator is 35 W and 0.6 slm of nominally pure helium is injected as a plasma-forming gas (G) versus 0.6 slm nominally pure helium only (G) without power.

Since in the absence of culture medium cells are more sensitive to physical factors such as damage by the drying effect of the gas flow, FIG. 9 indicates that the first configuration (both Ω and γ modes but especially the γ mode) may be more suited to direct treatment of cells. In fact, using the γ mode, almost no cells are damaged by the gas flow but almost all cells are damaged by the non-thermal plasma.

Different treatment methods have been investigated. The first configuration (FIG. 2A) was found advantageous for the direct treatment of cells deposited on the bottom of a Petri dish. The second configuration (FIG. 2C) proved to be advantageous for the treatment of cells suspended in a medium contained for example in microtubes.

The present convertible plasma source may be used in conjunction with breast conservative surgery or mastectomy after removing breast cancer tumors for example. The convertible plasma source is then used to treat the tumor bed and other tissues after removal of the tumor to kill residual cancer cells with reduced damage to healthy cells. According to in vitro treatment results, the first configuration may be best suited for such application. The second configuration may be selected to reach larger depth penetration into a d, such as human tissues for example, extending from a micrometer range in the first configuration to a millimeter range for example, depending on the material. For instance, experimental data for the first configuration show penetration depths of about 300 µm in a tumor, and in the jet mode, penetration depths of a few millimeters in a suspension of cells are measured. During a surgery, the second configuration may be used to treat with high dose small regions with remaining cancer cells or tumour, providing a method to reach regions that are hard to reach or that are located where resection is not possible for example, thus further reducing the risk of leaving cancerous cells in the tumor bed or other tissues. Both configurations can produce plasma-treated liquids that may be used to clean the tumor bed before closing the wound. Finally, after surgery, both configurations may be used to disinfect the wound, accelerate healing and reduce the size of the scar.

The present plasma source may be used for cancer treatment of: AU565, MDA-MB-231, MDA-MB-361 MDA-MB-468, MDA-MB-157, MDA-MB-175-VII, BT-549, MCF-7, HS578T, HCC1428, HCC1569, HCC1954, T47D and ZR-75-1 breast cancer cell lines and STS117 and STS109 soft tissue sarcoma cell lines for example.

Thus, the present convertible plasma source may be used in different configurations, each configuration allowing generating different plasma volumes having different characteristics relevant for different applications, in the medical field for example. This versatility is reflected on the results obtained for applications of cancer treatment.

In general, applications in oncology or in other medical areas such as, for example, chronic wound healing, dentistry, cosmetic, dermatology etc., and non-medical fields such as surface functionalization and thin film coating, may benefit from the present convertible plasma source.

In case of a coaxial plasma source as illustrated herein, the diameter of the central electrode (PE) may be selected to generate an almost uniform electric field between the electrodes, and thus to maintain a plasma volume in the Ω mode in the first configuration (FIG. 2A), as well as plasma operation in the second configuration (FIG. 2C). The present convertible plasma source may be switched from a first configuration to a second configuration, allowing for two configurations with a single plasma source. As switching from one configuration to another may be easily performed and does not require any mechanical alteration of the device, the user, for example a surgeon, may switch configurations at will during operation, and switching requires about 1 s. This is as if the end user had three plasma devices in a single one, providing a first configuration in Ω mode, the first configuration in γ mode and a second configuration in a jet mode.

The ability to select a specific configuration of the plasma source allows selectively targeting the specificities of each application and optimizing a specific application. A multi-configuration convertible plasma source as described herein is also of interest for laboratory testing of different effects of plasma on substrates, as described earlier for the treatment of back-grown cells on the bottom a Petri dish with the first configuration or suspended cells with the second configuration, for example.

The present configurable multimode plasma source and method for generating non-thermal plasmas, defined as Ω mode (first configuration), γ mode (first configuration), and jet mode (second configuration), and related plasma effluents may be applied to the selective production of a range of reactive species for applications where plasma chemistry flexibility and purity are required, with versatility and control of the nature of plasma reactive species selectively generated.

The plasma source comprises a first hollow electrode and a second hollow electrode separated by a gap and a dielectric barrier of a constant width; wherein the plasma source is configured to selectively produce a plasma in either one of a first configuration and a second configuration; wherein, i) in the first configuration, a plasma-forming gas flows in the gap while a non plasma-forming gas flows within the first hollow electrode; and ii) in the second configuration, a plasma-forming gas flows within the first hollow electrode and a non plasma-forming gas flows within the gap. The method comprises selecting at least two gases of different breakdown voltages, injecting a first gas in a first electrode separated from a second hollow electrode by a gas gap of a constant width, injecting a second gas in the gas gap under an applied power.

The scope of the claims should not be limited by the embodiments set forth in the examples, but should be given the broadest interpretation consistent with the description as a whole.

The invention claimed is:

1. A plasma source, comprising:
   a first hollow electrode and a second hollow electrode separated by a gap of a constant width and a dielectric barrier;
   wherein, providing a plasma-forming gas having a first breakdown voltage and a non plasma-forming gas having a second breakdown voltage larger than the first breakdown voltage, the plasma source is configured to selectively produce a plasma in either one of a first configuration and a second configuration;
   wherein:
   i) in the first configuration:
   the plasma-forming gas flows in said gap while the non plasma-forming gas flows within said first hollow electrode; and
   ii) in the second configuration, the plasma-forming gas flows within said first hollow electrode and the non plasma-forming gas flows within said gap.

2. The plasma source of claim 1, wherein a source of reactive species is injected in at least one of: i) the plasma-forming gas, and ii) the non plasma-forming gas.

3. The plasma source of claim 1, wherein a source of reactive species is injected in at least one of: i) the plasma-forming gas, and ii) the non plasma-forming gas, the source of reactive species being at least one of: $N_2$, $O_2$, air, gaseous chemical compounds, vapour and an aerosol.

4. The plasma source of claim 1, wherein at least one of said first and second electrodes is a powered electrode.

5. The plasma source of claim 1, wherein said first hollow electrode is centered within said second hollow electrode in a coaxial geometry.

6. The plasma source of claim 1, wherein said first hollow electrode is centered within said second hollow electrode in a coaxial geometry, said second hollow electrode having a length in a range between 5 mm and 1 m and said first hollow electrode is receded within said second hollow electrode, and wherein plasma is induced by a voltage waveform with a sinusoidal excitation frequency in a range between 100 Hz and 100 MHz.

7. The plasma source of claim 1, wherein said first hollow electrode is centered within said second hollow electrode in a coaxial geometry, said second hollow electrode has a length in a range between 5 mm and 1 m and said first hollow electrode is receded within said second hollow electrode by at least 1 mm, and wherein plasma is induced by a voltage waveform with a sinusoidal excitation frequency in a range between 100 Hz and 100 MHz, the plasma source operating at a plasma power density in a range between 0.1 W/cm$^3$ and 500 W/cm$^3$.

8. The plasma source of claim 1, wherein said first hollow electrode is centered within said second hollow electrode in a coaxial geometry, said second hollow electrode has a length in a range between 5 mm and 1 m and said first hollow electrode is receded within said second hollow electrode by at least 1 mm; wherein plasma is induced by a voltage waveform with a sinusoidal excitation frequency in a range between 100 Hz and 100 MHz; and, in the second configuration, in case the non plasma-forming gas in the gap is a static volume, the plasma-forming gas is made to fill said first hollow electrode at a flow rate of at least 0.1 slm.

9. The plasma source of claim 1, comprising a gas feeding unit, said gas feeding unit selectively operating the plasma source in the first configuration and the second configuration.

10. The plasma source of claim 1, comprising a gas feeding unit, said gas feeding unit controlling injection of the plasma-forming gas into one of: i) the first hollow electrode and ii) the gap, and controlling injection of the non plasma-forming gas into one of: i) the first hollow electrode and ii) the gap.

11. The plasma source of claim 1, wherein the plasma-forming gas is made to flow when switching between the first and the second configurations to purge the plasma source.

12. The plasma source of claim 1, configured to target cancer cells.

13. The plasma source of claim 1, configured to target at least one of: AU565, MDA-MB-231, MDA-MB-361 MDA-MB-468, MDA-MB-157, MDA-MB-175-VII, BT-549, MCF-7, HS578T, HCC1428, HCC1569, HCC1954, T47D and ZR-75-1 breast cancer cell lines; STS117 and STS109 soft tissue sarcoma cell lines.

14. The plasma source of claim 1, configured to target cancer cells in a tumor bed after resection of a tumor.

15. The plasma source of claim 1, configured to one of: disinfect a wound, accelerate healing and reduce a size of a scar after surgery.

16. The plasma source of claim 1, configured to produce plasma-activated liquids.

17. The plasma source of claim 1, the plasma source configured in one of: i) said first configuration to generate a low power density plasma with low penetration depth and ii) said second configuration to generate high power density plasma with high penetration depth.

18. The plasma source of claim 1, the plasma source configured for producing cytotoxic reactive species, the plasma source further comprising injecting a first gas in a first electrode separated from a second hollow electrode by a gas gap of a constant width, and injecting a second gas in the gas gap under an applied power, the first and second gases having different breakdown voltages.

19. The plasma source of claim 1, the plasma source configured for producing reactive species, the plasma source further comprising injecting a first gas in a first electrode separated from a second hollow electrode by a gas gap of a constant width, and injecting a second gas in the gas gap under an applied power, the first and second gases having different breakdown voltages.

20. A plasma generation method, comprising:
providing a first hollow electrode and a second hollow electrode separated by a gap of a constant width and a dielectric barrier;
selecting a plasma-forming gas having a first breakdown voltage and a non plasma-forming gas having a second breakdown voltage larger than the first breakdown voltage; and
selectively producing a plasma by either one of:
i) injecting the plasma-forming gas in the gap and the non plasma-forming gas within the first hollow electrode; and
ii) injecting the plasma-forming gas within the first hollow electrode and the non plasma-forming gas flows within the gap.

* * * * *